(12) United States Patent
Werner

(10) Patent No.: US 8,975,640 B2
(45) Date of Patent: Mar. 10, 2015

(54) HETEROJUNCTION SEMICONDUCTOR DEVICE AND MANUFACTURING METHOD

(71) Applicant: Infineon Technologies Austria AG, Villach (AT)

(72) Inventor: Wolfgang Werner, Munich (DE)

(73) Assignee: Infineon Techonologies Austria AG, Villach (AU)

( * ) Notice: Subject to any disclaimer, the term of this patent is extended or adjusted under 35 U.S.C. 154(b) by 0 days.

(21) Appl. No.: 13/872,391

(22) Filed: Apr. 29, 2013

(65) Prior Publication Data

US 2014/0319532 A1    Oct. 30, 2014

(51) Int. Cl.
| | |
|---|---|
| *H01L 29/15* | (2006.01) |
| *H01L 29/778* | (2006.01) |
| *H01L 29/20* | (2006.01) |
| *H01L 29/66* | (2006.01) |

(52) U.S. Cl.
CPC .......... *H01L 29/778* (2013.01); *H01L 29/2003* (2013.01); *H01L 29/66431* (2013.01)
USPC .............................. 257/76; 257/194; 438/172

(58) Field of Classification Search
CPC ............ H01L 29/778; H01L 29/66431; H01L 29/2203; H01L 29/66462; H01L 29/7787; H01L 2924/13064
USPC ..................................... 257/76, 194; 438/172
See application file for complete search history.

(56) References Cited

U.S. PATENT DOCUMENTS

| | | | | |
|---|---|---|---|---|
| 5,084,750 | A * | 1/1992 | Adlerstein | 257/574 |
| 2009/0134434 | A1 | 5/2009 | Werner | |
| 2012/0299059 | A1 * | 11/2012 | Takizawa et al. | 257/190 |

FOREIGN PATENT DOCUMENTS

| | | |
|---|---|---|
| DE | 10005772 B4 | 11/2006 |
| EP | 0184016 A1 | 6/1986 |

OTHER PUBLICATIONS

Hayashi et al. "New High-Voltage Unipolar Mode p+ Si/n-4H-SiC Heterojunction Diode." Materials Science Forum, vols. 483-485. Trans Tech Publications, 2005. pp. 953-956.

Tanaka et al. "Ultra-low Von and High Voltage 4H-SiC Heterojunction Diode." Proceedings of the 17th International Symposium on Power Semiconductor Devices & IC's. May 23-26, 2005 Santa Barbara, CA. pp. 1-3.

* cited by examiner

*Primary Examiner* — Tu-Tu Ho
(74) *Attorney, Agent, or Firm* — Murphy, Bilak & Homiller, PLLC

(57) ABSTRACT

A heterojunction semiconductor device having a semiconductor body is provided. The semiconductor body includes a first semiconductor region comprising aluminum gallium nitride, a second semiconductor region comprising gallium nitride and forming a heterojunction with the first semiconductor region, an n-type third semiconductor region, a p-type fourth semiconductor region forming a first rectifying junction with the third semiconductor region, and an n-type seventh semiconductor region adjoining the heterojunction formed between the first semiconductor region and the second semiconductor region. The first rectifying junction forms a rectifying junction of a transistor structure which is in ohmic contact with the seventh semiconductor region. Further, a method for producing such a heterojunction semiconductor device is provided.

18 Claims, 8 Drawing Sheets

HETEROJUNCTION SEMICONDUCTOR DEVICE AND MANUFACTURING METHOD

TECHNICAL FIELD

Embodiments of the present invention relate to heterojunction semiconductor devices, in particular to heterojunction semiconductor transistors, and to related methods for producing heterojunction semiconductor devices.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (High-electron-mobility Field Effect Transistor) also known as heterostructure FET (HFET) and modulation-doped FET (MODFET) have been used for various applications including but not limited to use as switches in power supplies and power converters, electric cars, air-conditioners, and in consumer electronics, for example stereo systems and communication technology.

In recent years, HEMTs have found wider use in low loss high frequency and low loss high power applications. In particular, Gallium nitride (GaN) based HEMT-devices have been found to be well suited for use in DC rectifiers, power microwave and radar amplifiers, low noise amplifiers, and high temperature elements, etc. Gallium nitride (GaN) material shows a high polarization effect, including spontaneous polarization and piezoelectric polarization. Even without being doped, this polarization effect allows forming a two-dimensional-electron gas (2DEG) adjacent to an interface (heterojunction) of a GaN/AlGaN (gallium nitride/aluminum gallium nitride) heterojunction structure (or GaN/AlInGaN, AlGaN/AlInGaN, aluminum indium gallium nitride). In a 2DEG, the electron concentration is related to the intensity of polarization. 2DEG sheet electron concentration of GaN/AlGaN heterojunction structures can reach very high values. Furthermore, the electron mobility of the 2DEG of GaN/AlGaN-HEMTs is about twice as high compared to the bulk electron mobility of silicon (Si) or silicon carbide (SiC). Therefore, field-effect-transistors based on GaN/AlGaN heterojunction structures are able to control very large currents.

HEMTs are typically normally-on devices using an insulated gate electrode or a Schottky contact for switching, for example a TiN/W-contact on AlGaN. Manufacturing of such structures with Schottky contacts is complicated and not always reproducible. Furthermore, the leakage current of Schottky contacts is often too high for power applications. Alternatively, an insulating gate dielectric such as silicon oxide may be arranged between the undoped AlGaN and a gate electrode used for switching. However, this results in an insulator-insulator interface between the gate dielectric and the undoped AlGaN. This insulator-insulator interface is likely to be charged during operation, in particular at higher temperatures. Thus the threshold voltage of the gate electrode may shift during operation.

Approaches to form normally-off-devices often desired in many applications, i.e. enhancement devices, include a p-doped AlGaN or p-doped GaN barrier layer between the gate and the undoped barrier layer of GaN/AlGaN-HEMTs to raise the conductivity band of the barrier layer such that the threshold voltage of the device is shifted to positive values. In order to obtain functional devices, the undoped barrier layer should not produce a too high density of the 2DEG, which counteracts the threshold voltage rise. However, reducing the density of the 2DEG also reduces the conductivity of the drift region between source and drain.

Accordingly, there is a need to improve heterojunction semiconductor devices.

SUMMARY

According to an embodiment of a heterojunction semiconductor device, the heterojunction semiconductor device includes a semiconductor body including: a first semiconductor region comprising aluminum gallium nitride, a second semiconductor region comprising gallium nitride and forming a heterojunction with the first semiconductor region, an n-type third semiconductor region, a p-type fourth semiconductor region forming a first rectifying junction with the third semiconductor region, and an n-type seventh semiconductor region adjoining the heterojunction formed between the first semiconductor region and the second semiconductor region, wherein the first rectifying junction forms a rectifying junction of a transistor structure which is in ohmic contact with the seventh semiconductor region.

According to an embodiment of a high-electron-mobility field effect transistor, the high-electron-mobility field effect transistor includes a first metallization, a second metallization, a third metallization, and a semiconductor body. The semiconductor body includes a first semiconductor region of a first semiconductor material having a first band-gap, a second semiconductor region of a second semiconductor material having a second band-gap lower than the first band-gap and forming with the first semiconductor region a heterojunction in ohmic contact with the third metallization, an n-type third semiconductor region in ohmic contact with the second metallization and having a third band-gap; and a p-type fourth semiconductor region in ohmic contact with the first metallization. The fourth semiconductor region adjoins the third semiconductor region and has a fourth band-gap lower than at least one of the second band-gap and the third band-gap.

According to an embodiment of a method for producing a heterojunction semiconductor device, the method includes: providing a wafer having a main surface, a first semiconductor layer and a second semiconductor layer forming a heterojunction with the first semiconductor layer; forming a vertical trench from the main surface, through the first semiconductor layer and into the second semiconductor layer; increasing a concentration of n-type dopants in at least two spaced apart portions of the wafer next to the main surface; and forming in the vertical trench a base region having a band-gap lower than a band-gap of the first semiconductor layer and lower than a band-gap of the second semiconductor layer, so that the base region forms a first rectifying junction with a first portion of the at least two spaced apart portions and a second rectifying junction with a second portion of the at least two spaced apart portions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
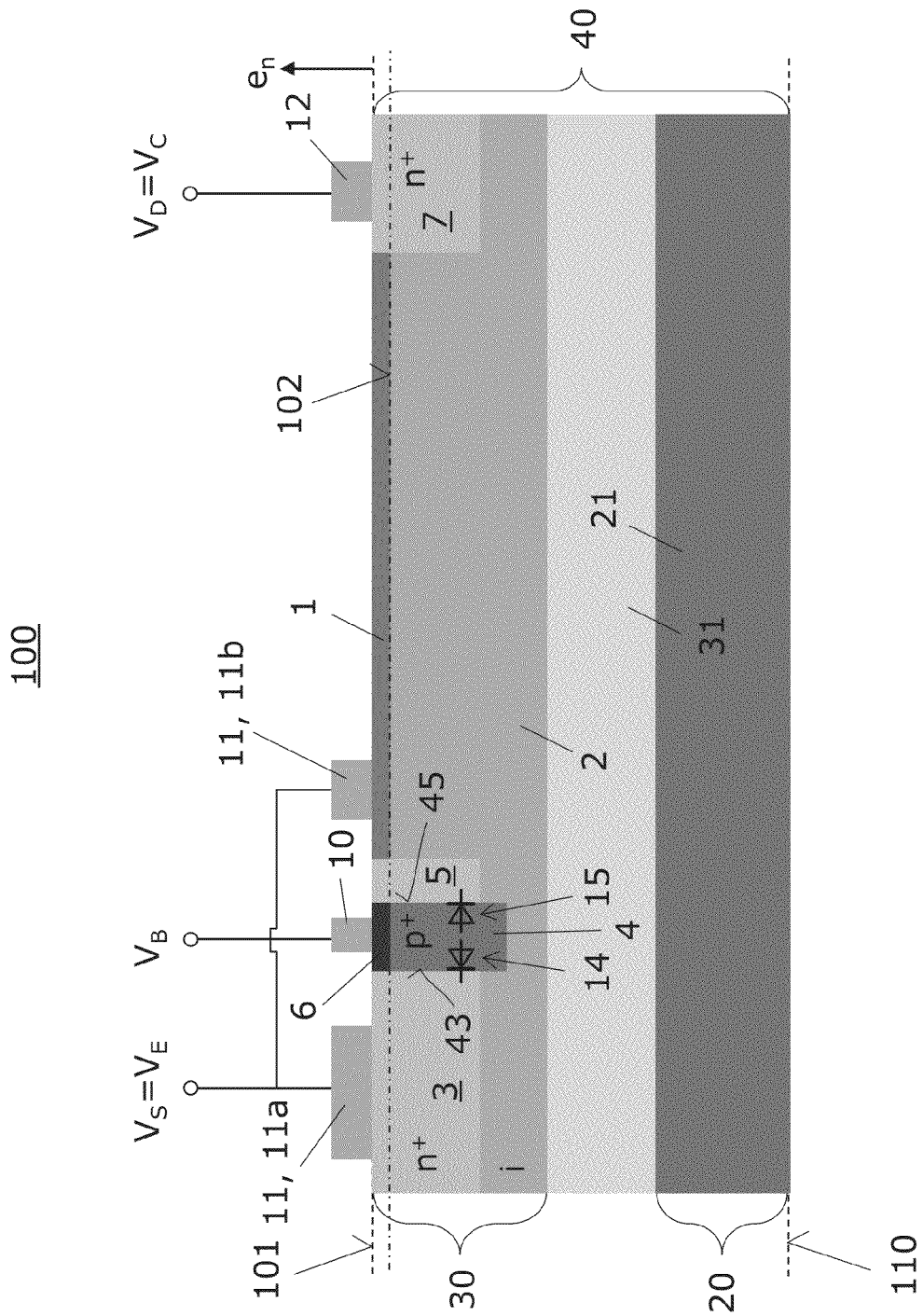
FIG. 1 illustrates a cross-section through a semiconductor body of a heterojunction semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to heterojunction semiconductor devices, in particular to high-electron-mobility field effect transistors, and to manufacturing methods therefor.

The term "heterojunction" as used in this specification intends to describe an interface between two layers or regions of a semiconductor material with different crystal structure. These semiconducting materials have typically different band gaps.

Typically, the semiconductor device is a power semiconductor device having an active area with a plurality of transistor-cells for carrying and/or controlling a load current between two load metallization. Furthermore, the power semiconductor device may have a peripheral area with at least one edge-termination structure at least partially surrounding an active area of transistor-cells when seen from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above 100 V, more typically above 400 V.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, $PtSi$, $CoSi_2$, $WSi_2$ or the like. The metallization may also include different electrically conductive materials, for example a stack of those materials.

With reference to FIG. 1, embodiments of a heterojunction semiconductor device 100 are explained. FIG. 1 illustrates a schematic cross-section through a semiconductor body 40 of the semiconductor device 100. In the exemplary embodiment, the semiconductor body 40 includes a main surface 101 defining a vertical direction $e_n$, a first semiconductor region 1 extending to the main surface and of a first semiconductor material having a first band-gap, and a second semiconductor region 2 of a second semiconductor material having a second band-gap which is lower than the first band-gap. The first semiconductor region 1 and the second semiconductor region 2 form a heterojunction 102 which is substantially parallel to the main surface 101. A 2DEG (not shown) is typically formed at the heterojunction 102 between the first semiconductor region 1 and the second semiconductor region 2.

According to an embodiment, the second semiconductor region 2 is made of gallium nitride (GaN) and the first semiconductor region 1 is made of aluminum indium nitride (AlInN), or more typically of aluminum gallium nitride (AlGaN). In these embodiments, the first semiconductor region 1 and the second semiconductor region 2 are typically substantially undoped (of intrinsic conductivity as indicated by the reference symbol "i" in the second semiconductor region 2). This still allows forming the 2DEG at the heterojunction 102 and facilitates high break-down voltages of the three-terminal semiconductor device 100 forming a transistor, typically a power transistor.

In the exemplary embodiment illustrated in FIG. 1, the semiconductor body 40 further includes an n-type third semiconductor region 3 extending to the main surface 101, a p-type fourth semiconductor region 4 forming with the third semiconductor region 3 a first rectifying junction 4 of a transistor structure 14, 15 with two anti-serially connected junction diodes 14, 15, an n-type fifth semiconductor region 5 adjoining the heterojunction 102 formed between the first semiconductor region 1 and the second semiconductor region 2, and forming with the fourth semiconductor region 4 a second rectifying junction 45 of the transistor structure 14, 15, and an n-type seventh semiconductor region 7 adjoining the heterojunction 102 formed between the first semiconductor region 1 and the second semiconductor region 2.

Further, a first metallization 10 in Ohmic contact with the fourth semiconductor region 4, a second metallization 11, 11a, 11b in Ohmic contact with the third semiconductor region 3, and a third metallization 12 in Ohmic contact with the seventh semiconductor region 7 are arranged on the main surface 101. The third metallization 12 is further in Ohmic contact with the transistor structure 14, 15 via the seventh semiconductor region 7 and the 2DEG at the heterojunction 102 between the between the first semiconductor region 1 and the second semiconductor region 2.

Typically, the third semiconductor region 3 and the fifth semiconductor region 5 form a source zone and the seventh semiconductor region 7 forms a drain zone of a HEMT-structure. With regard to the HEMT-structure, the first metallization 10, the second metallization 11 and the third metallization 12 typically form a control metallization 10, a source metallization 11, and a drain metallization 12, respectively.

In the exemplary embodiment illustrated in FIG. 1, the HEMT-structure is controlled by the transistor structure 14, 15 arranged in and being partly formed by the source zone 3, 5. Accordingly, no gate dielectric is required and the semiconductor device 100 is a normally-off semiconductor device. The transistor structure 14, 15 is in the following also referred to as control transistor structure.

With regard to the control transistor structure 14, 15, the third semiconductor region 3, the fourth semiconductor region 4, the fifth semiconductor region 5, the first metallization 10, the second metallization 11 and the third metallization 12 typically form an emitter region 3, a base region 4, a collector region 5, a control metallization 10, an emitter metallization 11, and a collector metallization 12, respectively.

The switching states "on" and "off" of the control transistor structure 14, 15 and thus of the semiconductor device 100 may be controlled by applying an appropriate control voltage $V_B$ to the control metallization 10.

According to an embodiment, the second metallization 11 has, in the cross-section a first portion 11a arranged on and in contact with the third semiconductor region 3 and a second portion 11b adjoining the first semiconductor region 1, arranged between the first metallization 10 and the third metallization 12. The second portion 11b is close to the fifth semiconductor region 5, but spaced apart from the fifth semiconductor region 5 and the seventh semiconductor region 7. The first portion 11a and the second portion 11b are at least during device operation on the same voltage $V_S=V_E$ which may be referred to as source voltage $V_S$ with regard to the HEMT-structure and emitter voltage $V_E$ with regard to the control transistor structure 14, 15, respectively. If the control transistor structure 14, 15 is non-conducting, i.e. in the off-state, and a non-zero voltage difference $V_{SD}=V_S-V_D$ is applied between the second metallization 11 and the third metallization 12, most of the voltage difference $V_{SD}$ drops in the semiconductor body 40 within the first semiconductor region 1 and the second semiconductor region 2 which substantially behave like insulators having a high break-down field strength under this condition. Note that the voltage $V_D=V_C$ may be referred to as drain voltage $V_D$ with regard to the HEMT-structure and collector voltage $V_C$ with regard to the control transistor structure. The switchable maximum voltage difference $V_{SD}$ mainly depends on the distance between the second portion 11b and the third metallization 12. Thus, high voltages may be switched with the semiconductor device 100.

According to an embodiment, the control transistor structure 14, 15 is implemented as a heterojunction transistor structure 14, 15. Accordingly, both the first rectifying junction 43 and the second rectifying junction 45 are heterojunctions. The heterojunction transistors structures described herein may electronically be considered as two anti-serially connected heterojunction diodes 14, 15 which are integrated in the semiconductor body 40.

Typically, the third semiconductor region 3 has a third bad-gap and the fourth semiconductor region 4 has a fourth band-gap which is lower than the second band-gap and the third band-gap. In this embodiment, the injection of minority charge carriers (e.g. holes in the present embodiment) from the fourth semiconductor region 4 into the third semiconductor region 3 and into the fifth semiconductor region 5, i.e. into the source zone 5, is reduced. Accordingly, device performance such as switching losses of the heterojunction transistor structure 14, 15 and thus of the semiconductor device 100 may be improved compared to bipolar (heterojunction) transistors structures.

In other embodiments, at least one of the first rectifying junction 43 and the second rectifying junction 45 are pn-junctions formed between adjoining an oppositely doped semiconductor regions of the same semiconductor material (homojunctions). The heterojunction transistor structure 14, 15 may also be implemented as a heterojunction bipolar transistor structure with only one heterojunction having improved switching performance and/or high frequency performance compared to bipolar homojunction transistors.

According to an embodiment, the band-gaps and/or the crystal structures of the third semiconductor region 3 (emitter region), the fourth semiconductor region 4 (base region) and the fifth semiconductor region 5 (collector region) are chosen such that substantially no minority charge carriers are injected from the fourth semiconductor region 4 into the third semiconductor region 3 and into the fifth semiconductor region 5 during normal device operation. This means that, in the exemplary embodiment illustrated in FIG. 1, holes are substantially not injected from the p-type fourth semiconductor region 4 into the n-type third semiconductor region 3 and the n-type fifth semiconductor region 5 during normal device operation. Accordingly, minority charge carriers do not substantially contribute to the current, typically to less than a fraction of about $10^{-6}$ of the current between the collector region 5 and the emitter region 3. This further improves device operation compared to known bipolar (heterojunction) transistor in which minority charge carriers substantially contribute to the current in the emitter region, the base region and the collector region. Note that the heterojunction transistor structure 14, 15 formed by the two anti-serially connected heterojunction diodes 14, 15 is typically neither pure unipolar nor pure bipolar, but typically substantially unipolar.

Typically, the fourth band-gap is lower than the second band-gap and the third band-gap by at least about 1 eV. In this embodiment, the injection of minority charge carriers (e.g. holes in the present embodiment) from the fourth semiconductor region 4 into the third semiconductor region 3 and into the fifth semiconductor region 5, i.e. into the source zone 5, is reduced such that minority charge carriers do not substantially contribute to the current. Accordingly, device performance such as switching losses of the heterojunction transistor structure 14, 15 and thus of the semiconductor device 100 may be improved compared to bipolar (heterojunction) transistors. For example, the third semiconductor region 3 and the fifth semiconductor region 5 may made of and include, respectively, a wide band-gap material such as silicon carbide, aluminum gallium nitride and/or gallium nitride having band-gaps above about 2.26 eV (3C—SiC) and the fourth semiconductor region 4 may be made of silicon, germanium and or silicon germanium ($Si_xGe_{1-x}$) having comparatively low band-gaps of about 0.67 eV (Ge), 1.12 eV (Si) and in-between 0.67 eV and 1.12 eV ($Si_xGe_{1-x}$).

The third semiconductor region 3 and the fifth semiconductor region 5 may be made of different or more typically of the same semiconductor materials. Using the same materials facilitates manufacturing. For the same reason, the fourth semiconductor region 4 is typically a non-monocrystalline semiconductor region, for example a polycrystalline semiconductor region. In addition, mechanical stress may be reduced by using a non-monocrystalline fourth semiconductor region 4.

The maximum doping concentration of the fourth semiconductor region 4 is typically in a range from about $10^{18}$ $cm^{-3}$ to about $10^{20}$ $cm^{-3}$.

According to an embodiment, a p-type sixth semiconductor region 6 is arranged between the fourth semiconductor region 4 and first metallization 10. The sixth semiconductor region 6 has a higher maximum doping concentration than the fourth semiconductor region 4 and adjoins the fourth semiconductor region 4. Accordingly, the sixth semiconductor region 6 typically forms a base contact region of the control transistor structure 14, 15. The typically high doping gradient formed between the base region 4 and the base contact region 6 facilitates that electrons in the base region 4 do not flow to the base metallization 10 during normal operation.

In the exemplary embodiment illustrated in FIG. 1, the third semiconductor region 3, the fifth semiconductor region 5 and as well as the seventh semiconductor region 7 include in respective upper portions the semiconductor material of the first semiconductor region 1, for example AlGaN, and in respective lower portions the semiconductor material of the second semiconductor region 2, for example GaN. This is indicated by the dashed dotted line of the heterojunction 102. However, the third semiconductor region 3, the fifth semiconductor region 5 and the seventh semiconductor region 7 are heavily n-doped. For example, the third semiconductor region 3, the fifth semiconductor region 5 and the seventh semiconductor region 7 may be made of respective silicon doped GaN/AlGaN sandwich structures. A 2DEG may also be formed at the heterojunction 102 in the third semiconductor region 3, the fifth semiconductor region 5 and the seventh semiconductor region 7. However, this is electronically at most of minor importance. In the exemplary embodiment illustrated in FIG. 1, the heterojunction 102 in the third semiconductor region 3, the fifth semiconductor region 5 and the seventh semiconductor region 7 is a result of a manufacturing process as explained below with regard to FIGS. 7 and 8. In other embodiments, there is no heterojunction in the third semiconductor region 3, the fifth semiconductor region 5 and/or the seventh semiconductor region 7.

The maximum doping concentration of the third semiconductor region 3, the fifth semiconductor region 5 and/or the seventh semiconductor region 7 may be in a range from about $10^{18}$ $cm^{-3}$ to about $10^{20}$ $cm^{-3}$.

For sake of clarity, the heterojunction control transistor 14, 15 is in the following explained with regard to embodiments in which the collector region 5 and the emitter region 3 are made of the same wide-band-gap semiconductor material, i.e. the same chemical element or compound and the same crystal structure (polytype).

For 4-SiC/Si heterojunction diodes 14, 15 having a $p^+$-zone of Si (low-band gap material) forming a heterojunction with an $n^-$-zone of 4H-SiC the following properties are known. The breakdown voltage is for same doping concentrations about the same compared to a homojunction pn-SiC diode. The leakage current is comparable to a Schottky diode. For example, the leakage current of the heterojunction diodes 14, 15 may be about $2 \times 10^{-5}$ $A/cm^2$ at a reverse biasing of about 1000 V for a diode of 1600 V rated blocking voltage. During forward biasing, no holes are injected into the $n^-$-zone. Similar as for Schottky diodes, the electron current is provided by the $p^+$-zone. Furthermore, the density of the electrons of the $p^+$-zone at the heterojunction (pn-junction) is tuneable by the voltage drop across the heterojunction. Similar as for bipolar transistors, the electrons of the $p^+$-zone at the pn-junction is during reverse biasing with 100 V about $10^7$ $cm^{-3}$ and in forward bias of 1.2 V about $10^{16}$ $cm^{-3}$ (at given doping concentrations of $10^{20}$ $cm^{-3}$ for the $p^+$-zone and $10^{16}$ $cm^{-3}$ for the $n^-$-zone). A similar device behavior is to be expected for other wide band-gap/small band-gap heterojunction diodes such as GaN/Si heterojunction diodes 14, 15, AlGaN/Si heterojunction diodes 14, 15 and GaN/Ge heterojunction diodes 14, 15.

For a heterojunction control transistor structure 14, 15, the following properties are to be expected. If the heterojunction diode 14 is operated in forward mode, for example at a base-emitter voltage $V_{BE}=V_B-V_E$ of about 1.2 V and the other heterojunction diode 15 is operated in reverse mode, a diffusion current will flow through the base region 4 which is due to the large ratio of electron concentration between the emitter side and the collector side of about $10^9$. The diffusion current depends on the base-emitter voltage $V_{BE}$, the width of the base region 4 and the electron concentration at the emitter side. For a typical width of the base region 4 between the emitter region 3 and the collector region 5 of about 0.5 µm, the recombination of electrons and holes is neglectable in the base region 4. This results in the following advantages. The heterojunction transistor 14, 15 and thus the semiconductor device 100 is a normally-off switching device. The control voltages are in a low range of about 0 V to about 1.5 V. The static electric control power is almost zero. This is because no or almost no hole current is injected into the emitter region 3 and the collector region 5 during the off-state and because only a small collector-base reverse leakage current flows through the base region 4 during the off-state. The dynamic electric control power maybe substantially lower compared to MOSFETs and JFETs. This is because of the comparable input capacitances and the fact that the control transistor structure 14, 15 operates, due to the exponential input characteristics, at full level already at low voltages of about 1.5 V. Note that the control transistor structure 14, 15 and thus the semiconductor device 100 is, contrary to bipolar transistors, voltage controlled. Furthermore, the control transistor structure 14, 15 may be operated in a saturated mode in which the heterojunction 45 between the collector region 5 and the base region 4 (heterojunction diode 15) is forwardly biased. In this mode, the voltage drop between the collector metallization 12 and the emitter metallization 11 may be as low as about 0.1 V. Contrary to a bipolar transistor, no minority charge carriers are injected into the collector region 5. Accordingly, switching losses of the control transistor structure 14, 15 and the semiconductor device 100, respectively, are not increased when the saturated mode is used. Furthermore, even when the semiconductor device 100 is used to drive an inductive load, which may result in negative collector voltages $V_C$ (with $V_B=V_E=0$) during switching-off, no minority charge carriers are injected into the collector region 1 in the saturation mode. Accordingly, an additional free-wheeling diode as used for MOSFETS and JFETs is not required.

Compared to known GaN HEMTs, the HEMT 100 combines the following properties. The static control power and the dynamic control power are comparable with those of known GaN HEMTs. The HEMT 100 is a normally-off transistor. There is at most a tiny gate leakage current. There are no issues of a drift of the gate voltage and a gate breakdown to be expected. The control is not carried out at surface of the semiconductor body but in the bulk. Therefore, the HEMT 100 is expected to be very robust. Furthermore, this allows control of a stack of heterojunctions. Accordingly, the HEMT 100 is well suited for power applications. Even further, the HEMT 100 includes the function of an integrated free-wheeling Schottky-diode as often required for driving inductive loads. This means that the hetero diode 14 substantially operates as a Schottky-diode which facilitate an electron current between the drain metallization 12 and the source metallization 11 at negative drain voltage ($V_S>V_D$).

In the exemplary embodiment illustrated in FIG. 1, the semiconductor body 40 further includes a substrate 21 of, for example, a silicon carrier wafer 20 with a silicon layer and a buffer layer 31 arranged between the substrate 21 and the second semiconductor layer 2. The substrate 21 extends to a back surface 110 of the semiconductor device 100.

Figure 2:
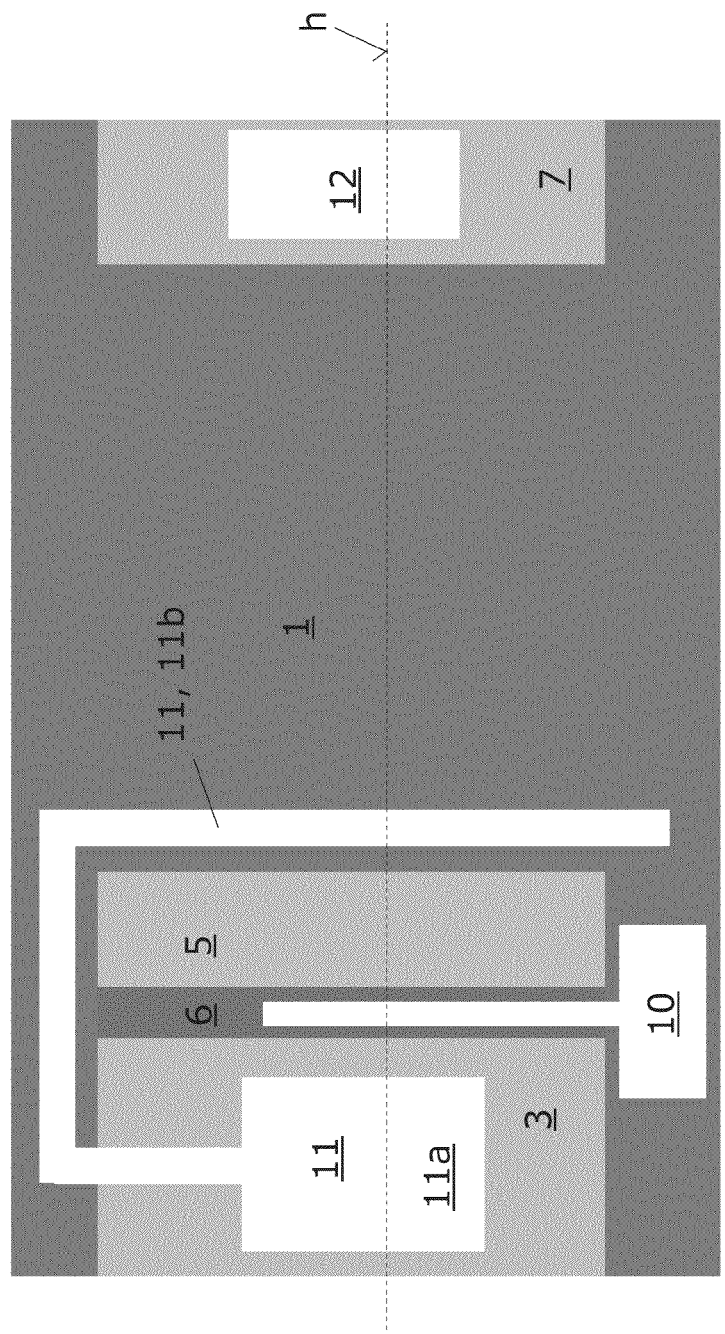
FIG. 2 illustrates a plan view on the heterojunction semiconductor device illustrated in FIG. 1 according to an embodiment.

FIG. 2 illustrates a plan view on the HEMT 100, i.e. a view on the main surface 101 of the semiconductor body 40. For sake of clarity, any dielectric regions that may be arranged between the first metallization 10, the second metallization 11, and the third metallization 12 are not shown in FIG. 2. FIG. 1 typically corresponds to a vertical cross-section along the dashed line 'h' in FIG. 2.

Typically, the second metallization 11, 11a, 11b is formed on the main surface 101 as a contiguous metallization. Accordingly, only three terminals are required for the semiconductor device 100.

Figure 3:
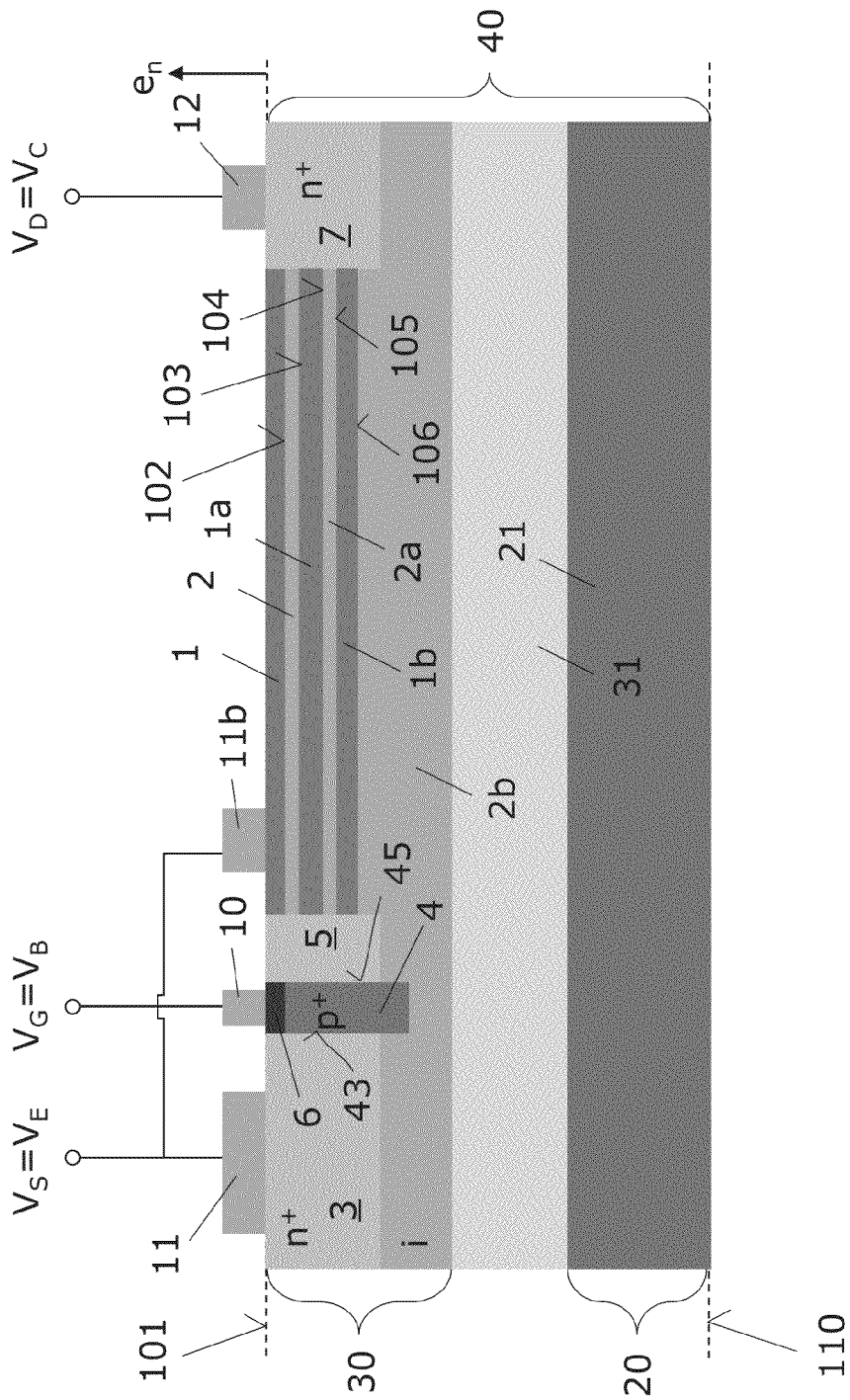
FIG. 3 illustrates a vertical cross-section through a semiconductor body of a heterojunction semiconductor device according to an embodiment.

FIG. 3 illustrates a vertical cross-section through a semiconductor device 200. The semiconductor device 200 is similar to the semiconductor device 100 explained above with regard to FIG. 1 and may also be operated as an HEMT. However, semiconductor device 200 includes a plurality of substantially parallel heterojunctions 102, 103, 104, 105, 106 which extend at least between the fifth semiconductor region 5 and the seventh semiconductor region 7, and are in Ohmic contact with the third metallization 12 and a control transistor structure 14, 15. Accordingly, a stack of controllable 2DEGs is formed which is suited for switching of large currents.

In the exemplary embodiment, the stack of five controllable 2DEGs is formed at heterojunctions 102, 103, 104, 105, 106 between alternating semiconductor layers or regions 1, 1a, 1b of a first semiconductor material, for example AlGaN, and semiconductor layers or regions 2, 2a, 2b of a second semiconductor material, for example GaN, having a lower band-gap than the first semiconductor material.

Figure 4:
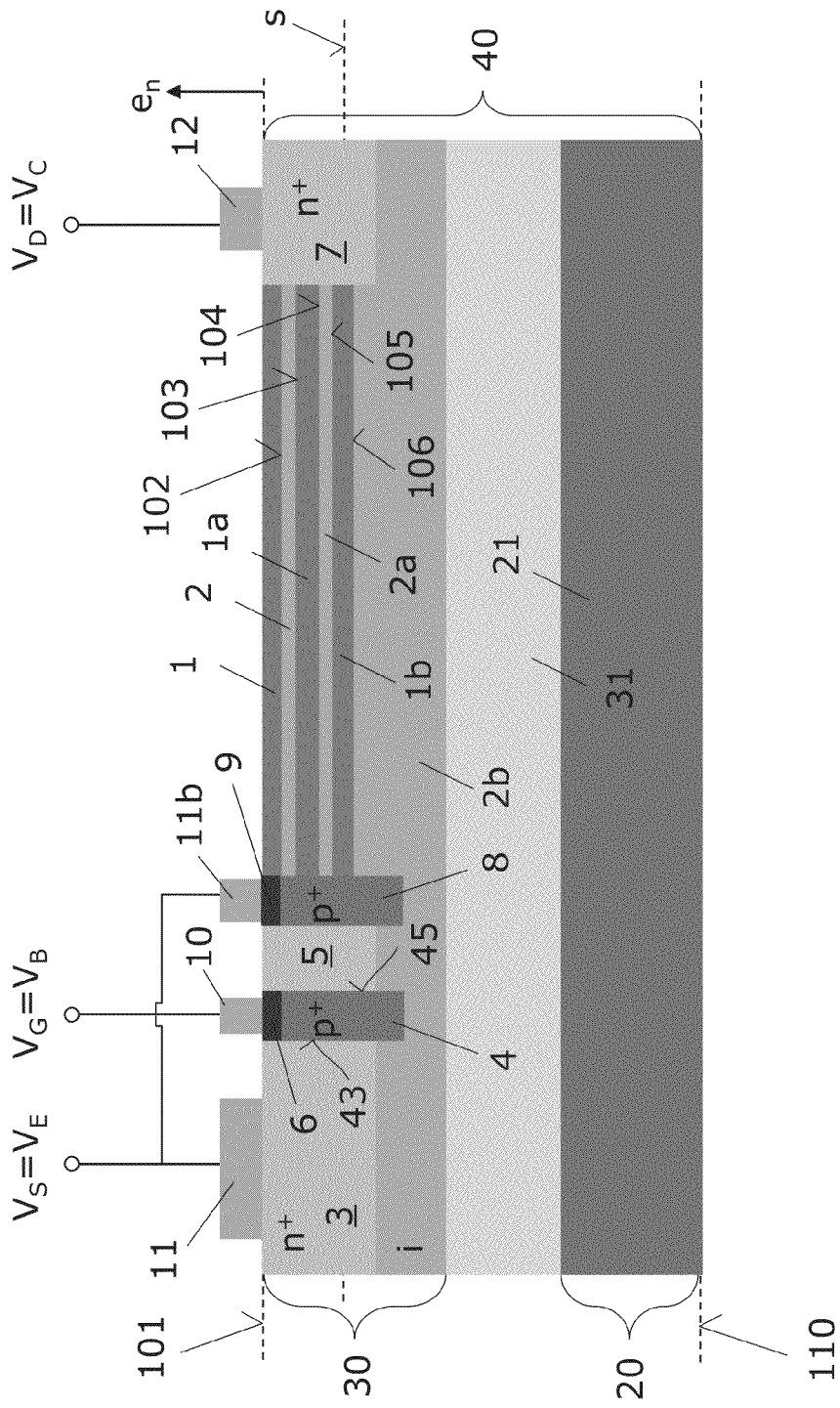
FIG. 4 illustrates a vertical cross-section through a semiconductor body of a heterojunction semiconductor device according to an embodiment.

FIG. 4 illustrates a vertical cross-section through a semiconductor device 300. The semiconductor device 300 is similar to the semiconductor device 200 explained above with regard to FIG. 3 and may also be operated as an HEMT. However, the semiconductor body 40 of the semiconductor device 300 further includes in one or more vertical cross-sections p-type eighth semiconductor region(s) 8 in ohmic contact with the second metallization 11, typically via a higher doped ninth semiconductor region 9. The eighth semiconductor region(s) 8 adjoins the fifth semiconductor region 5 and is arranged between the fifth semiconductor region 5 and the heterojunctions 102 to 106. Typically, the eighth semiconductor region(s) 8 forms a body-region or shielding region to improve device properties during the blocking mode.

Figure 5:
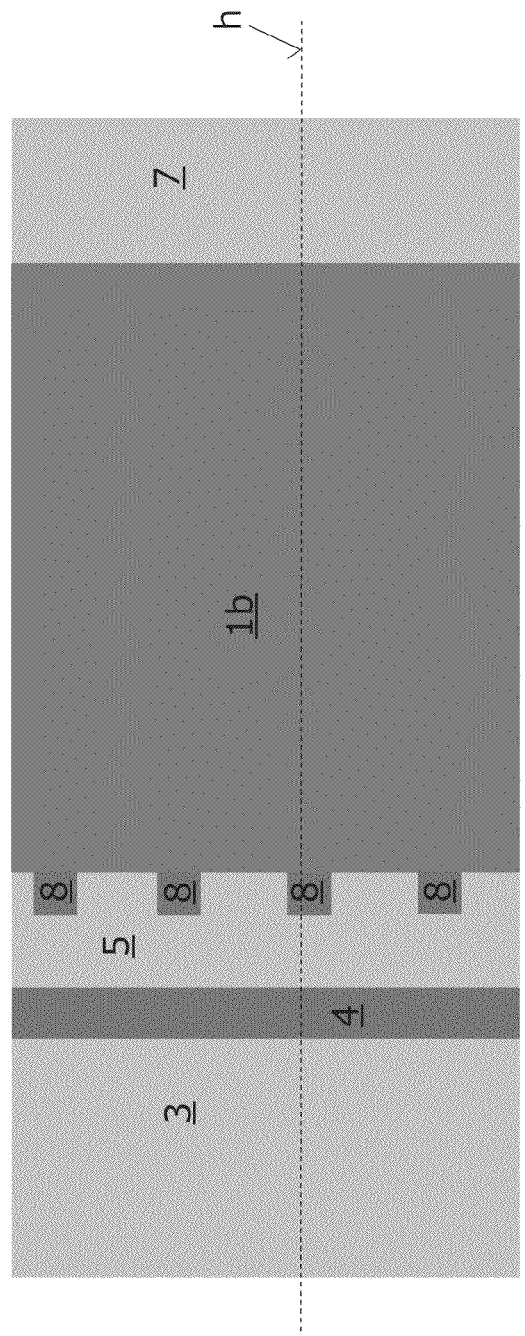
FIG. 5 illustrates a horizontal cross-section through the semiconductor body of the heterojunction semiconductor device illustrated in FIG. 3 according to an embodiment.

In other vertical cross-sections, the heterojunctions 102 to 106 extend to the fifth semiconductor region 5 to facilitate operating the semiconductor device 300 as an HEMT. This can be inferred from FIG. 5 illustrating a horizontal cross-section through the semiconductor body 40 of FIG. 4 along line 's'. FIG. 4 typically corresponds to a vertical cross-section along the dashed line 'h' in FIG. 5. Typically, the semiconductor device 300 has a plurality of spaced apart eighth semiconductor regions 8.

Typically, the eighth semiconductor regions 8 as well as the ninth semiconductor regions 9 are non-monocrystalline semiconductor regions of a low band-gap semiconductor material such as silicon, germanium or silicon germanium.

Typically, the fourth semiconductor region 4, the sixth semiconductor region 6, the eighth semiconductor region(s) 8 and the ninth semiconductor region(s) 9 are made of the same non-monocrystalline semiconductor material such as poly-Si to facilitate manufacturing. Further, the eighth semiconductor region(s) 8 and the fourth semiconductor region 4 may have substantially the same maximum doping concentration, and the sixth semiconductor region 6 and the ninth semiconductor region(s) 9 may have substantially the same maximum doping concentration. This facilitates manufacturing.

Figure 6:
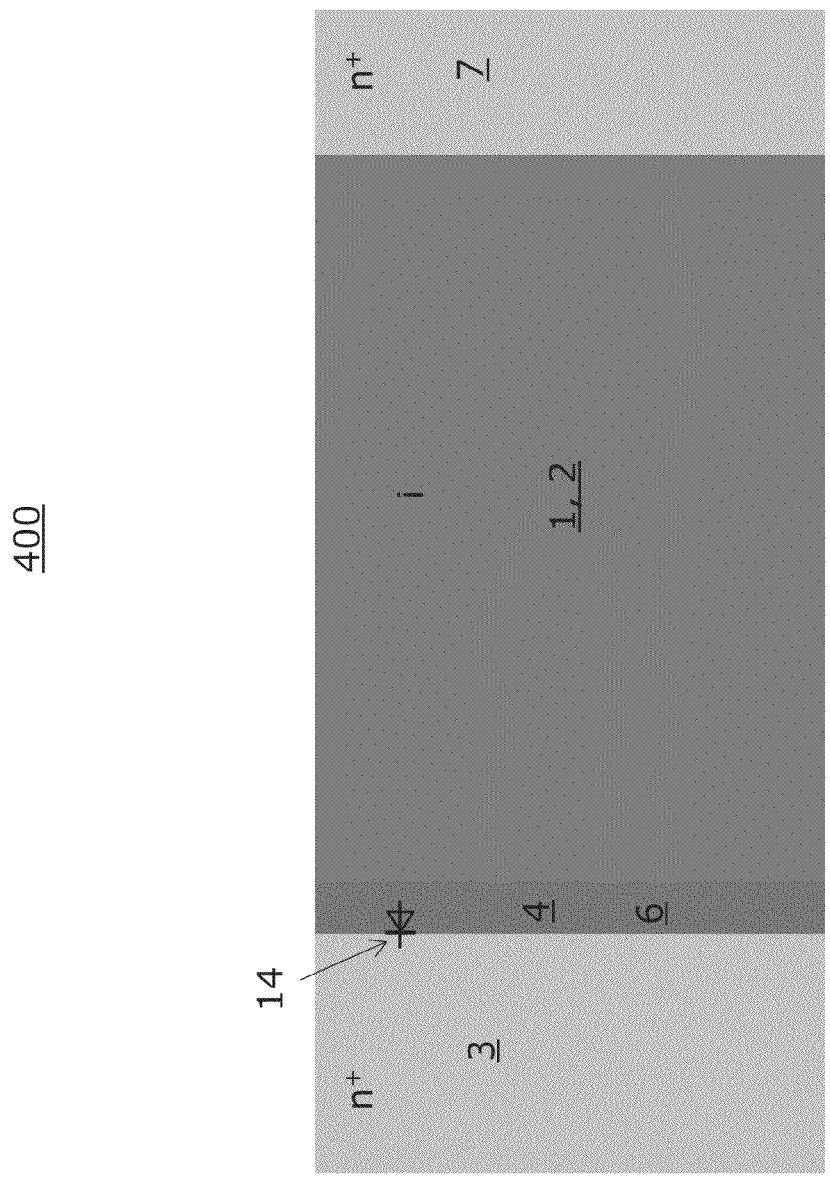
FIG. 6 illustrates a plan view on a semiconductor body of a heterojunction semiconductor device according to an embodiment.

FIG. 6 illustrates a plan view on a semiconductor body of a semiconductor device 400. The semiconductor device 400 is similar to the semiconductor device 100 explained above with regard to FIG. 1 and may also be operated as an HEMT. However, the semiconductor body 40 of semiconductor device 400 has no fifth semiconductor region 5. In the exemplary embodiment illustrated in FIG. 6, the control transistor structure is formed by the heterojunction diode 14 and a pin-diode formed between the p-type fourth semiconductor region 4 (and/or the sixth semiconductor region 6), the adjoining intrinsic first semiconductor region 1 (and/or the intrinsic second semiconductor region 2) and the n-type seventh semiconductor region 7.

The semiconductor devices 100 to 400 explained above with regard to FIGS. 1 to 6 have in common that the semiconductor body 40 includes a first substantially intrinsic wide band-gap semiconductor region 1, a second substantially intrinsic wide band-gap semiconductor region 2 forming a heterojunction 102 with the first semiconductor region 1, an n-type third semiconductor region 3, a fourth p-type low band-gap semiconductor region 4 forming with the third semiconductor region 3 a first rectifying heterojunction 43 of a control transistor structure, and an n-type seventh semiconductor region 7 which adjoins the heterojunction 102 and is in ohmic contact with the control transistor structure.

The second rectifying junction of the control transistor structure may be formed by a pin-diode or a second rectifying heterojunction 45 formed between the fourth semiconductor region 4 and a fifth n-type wide band-gap semiconductor region 5 adjoining the heterojunction 102.

Figure 7:
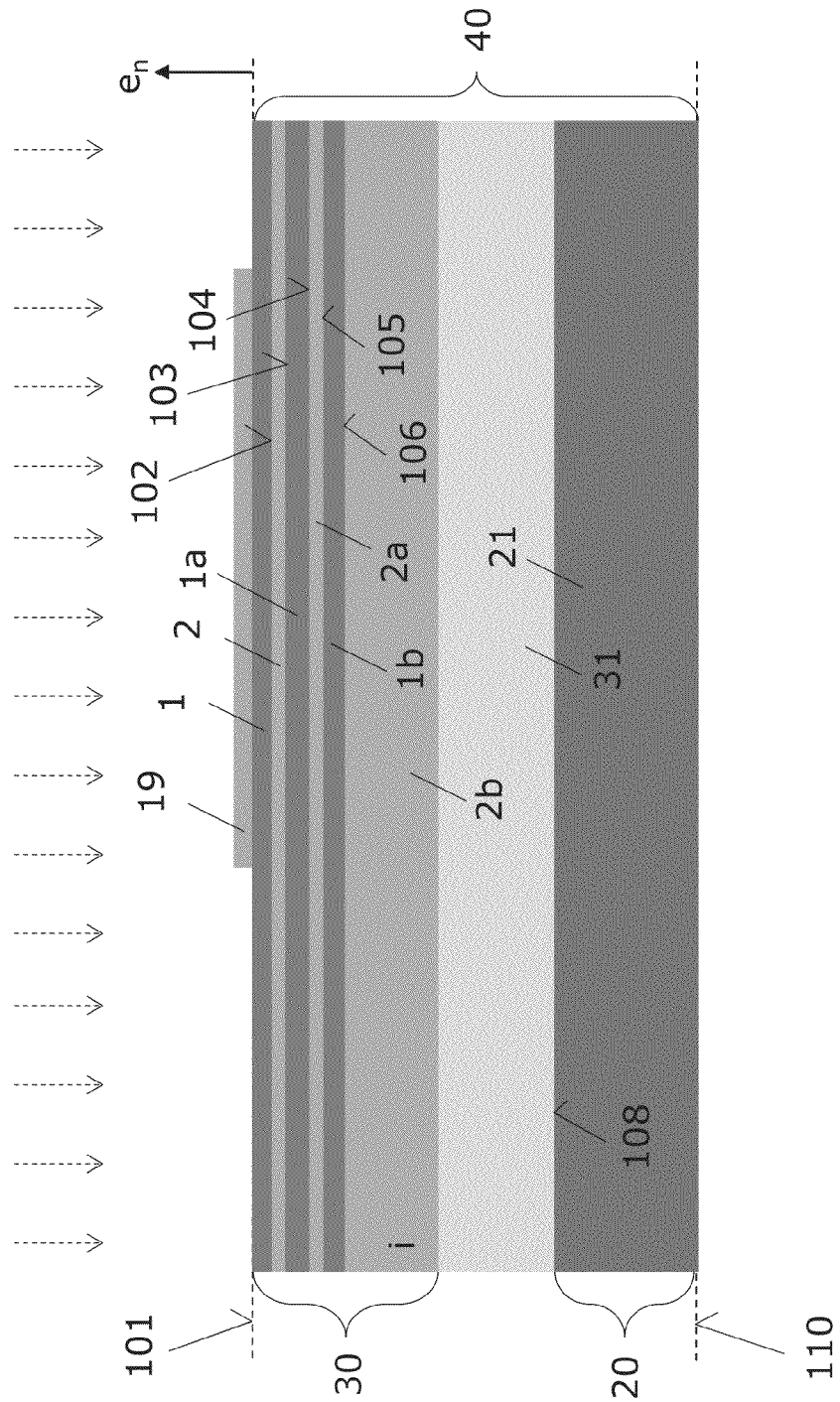
FIGS. 7 and 8 illustrates vertical cross-sections through a semiconductor body during steps of a method according to embodiments.
Figure 8:
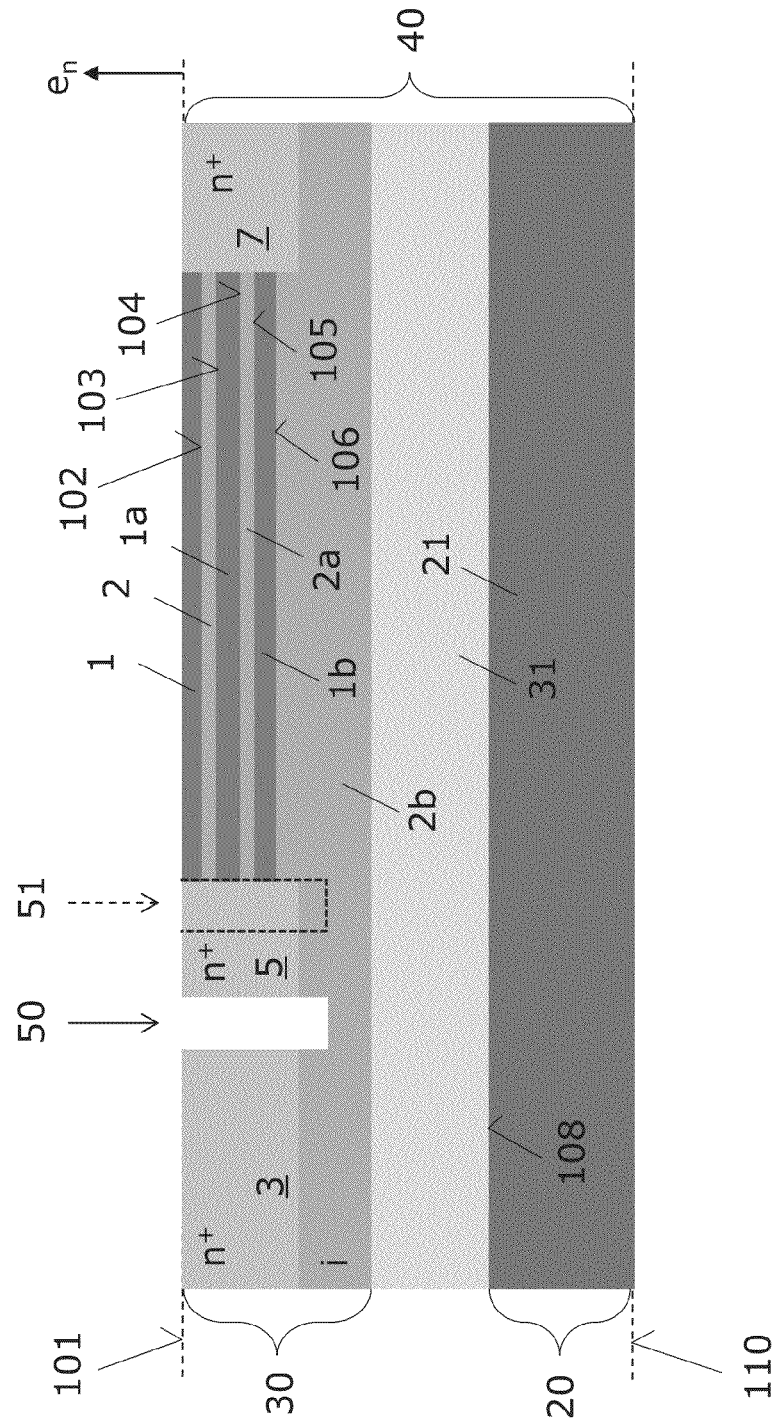

With regard to FIGS. 7 and 8, steps of a method for forming a semiconductor device are illustrated in respective vertical cross-sections through a semiconductor body 40 and semiconductor wafer 40, respectively.

In a first step, a wafer 40 extending between a main surface 101 and a back surface 110 arranged opposite the main surface 101 is provided. The wafer 40 includes one or more heterojunctions 102 to 106 formed between first semiconductor layer(s) 1, 1a, 1b and second semiconductor layer(s) 2, 2a, 2b of wide band-gap materials for example a stack of substantially intrinsic GaN/AlGaN layers. The wafer 40 typically includes a silicon carrier wafer 20 or a SiC-wafer and a buffer layer 31 formed on a silicon substrate layer 21 and a SIC-layer 21, respectively, of the carrier wafer 20. Above the buffer layer 31, the one or more heterojunctions 102 to 106 may be formed by alternatively depositing substantially un-doped layers of a first semiconductor material, e.g. GaN, and a second semiconductor material such as AlGaN having a different band-gap than the first semiconductor material.

Thereafter, a mask 19 may be formed on the main surface 101. The resulting semiconductor structure 300 is illustrated in FIG. 7.

Thereafter, a concentration of n-type dopants may be increased in two spaced apart portions left and right of the mask 19 and next to the main surface 101 by implantation as indicated by the downward arrows in FIG. 7 and subsequent annealing. For example, silicon may be used as n-type dopant for GaN and AlGaN.

Thereafter, a vertical trench 50 may be formed, typically etched, from the main surface 101 through the first semiconductor layer 1 and the heterojunction(s) 102-106. The resulting semiconductor structure 300 is illustrated in FIG. 8.

The masked implantation of n-type dopants and forming the vertical trench 50 is typically preformed such that in the vertical cross-section three spaced apart highly doped n-type wide band-gap semiconductor portions or regions 3, 5, 7 are formed, two of which 3, 5 are spaced from each other by the vertical trench 50.

Thereafter, a base region having a lower band-gap than the first semiconductor layer(s) 1, 1a, 1b and the second semiconductor layer(s) 2, 2a, 2b is formed in the vertical trench 50 so that the base region forms a first rectifying junction with a first portion 3 of the semiconductor portions 3, 5, 7 and a second rectifying junction with a second portion 5 the semiconductor portions 3, 5, 7. The second portion 5 and a third portion 7 of the three semiconductor portions 3, 5, 7 adjoin the heterojunction(s) 102-106.

According to an embodiment, at least one further vertical trench 51, typically a plurality of further trenches 51, is formed together with the first vertical trench 50 from the main surface 101, through the first semiconductor layer 1 and the heterojunction(s) 102-106. This is indicated by the dashed open rectangle in FIG. 8. In this embodiment, the further trench(es) 51 are typically formed such that the heterojunction(s) 102-106 extend to the second portion 5 in at least one vertical cross-section and are spaced apart from the second portion 5 by the further trench(es) 51 in at least one further vertical cross-sections which is substantially parallel to the at least one vertical cross-section. In the further trench(es) 51 p-type semiconductor region(s) are typically formed.

Forming the base region in the vertical trench 50 and/or the p-type semiconductor region(s) typically in the further trench(es) 51 typically includes depositing a p-doped non-monocrystalline semiconductor material, such as Si, Ge or $Si_xGe_{1-x}$ and back-etching and/or a CMP-process. Using a non-monocrystalline semiconductor material facilitates manufacturing. Typically, the non-monocrystalline semiconductor material is deposited such that a p-type dopant concentration reaches its maximum at least close to the main surface 101.

Furthermore, the first vertical trench 50 and the optional further vertical trenches 51 may be filled with the non-monocrystalline semiconductor material in common processes.

Thereafter, a first metallization 10 in ohmic contact with the base region 4, a second metallization 11 in ohmic contact with the first portion 3, and a third metallization 12 in ohmic contact with a third portion 7 may be formed on the main surface 101.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A heterojunction semiconductor device, comprising a semiconductor body comprising:
    a first semiconductor region comprising aluminum gallium nitride;
    a second semiconductor region comprising gallium nitride and forming a heterojunction with the first semiconductor region;
    an n-type third semiconductor region;
    a p-type fourth semiconductor region forming a first rectifying junction with the third semiconductor region; and
    an n-type seventh semiconductor region adjoining the heterojunction formed between the first semiconductor region and the second semiconductor region,
        wherein the first rectifying junction forms a rectifying junction of a transistor structure, the transistor structure being in ohmic contact with the seventh semiconductor region.

2. The semiconductor device of claim 1, further comprising an n-type fifth semiconductor region adjoining the heterojunction formed between the first semiconductor region and the second semiconductor region, and forming a second rectifying junction with the fourth semiconductor region, the second rectifying junction forming a further rectifying junction of the transistor structure.

3. The semiconductor device of claim 2, wherein the fifth semiconductor region has a higher band-gap than the fourth semiconductor region.

4. The semiconductor device of claim 2, wherein the fifth semiconductor region comprises at least one of aluminum gallium nitride and gallium nitride.

5. The semiconductor device of claim 4, wherein the fifth semiconductor region comprises silicon as n-type dopants.

6. The semiconductor device of claim 1, wherein the third semiconductor region has a higher band-gap than the fourth semiconductor region.

7. The semiconductor device of claim 1, wherein the fourth semiconductor region comprises at least one of silicon and germanium.

8. The semiconductor device of claim 1, wherein the fourth semiconductor region is a non-monocrystalline semiconductor region.

9. The semiconductor device of claim 1, wherein at least one of the third semiconductor region and the seventh semiconductor region comprises at least one of aluminum gallium nitride and gallium nitride.

10. The semiconductor device of claim 9, wherein at least one of the third semiconductor region and the seventh semiconductor region comprises silicon as n-type dopants.

11. The semiconductor device of claim 1, wherein at least one of the first semiconductor region and the second semiconductor region is an intrinsic semiconductor region.

12. The semiconductor device of claim 1, wherein the semiconductor body further comprises a further semiconductor region comprising aluminum gallium nitride which forms a further heterojunction with the second semiconductor region, the further heterojunction extending at least to the seventh semiconductor region.

13. The semiconductor device of claim 1, further comprising at least one of:
    an n-type fifth semiconductor region in ohmic contact with the heterojunction and forming a second rectifying junction with the fourth semiconductor region;
    a first metallization arranged on a main surface of the semiconductor body and in ohmic contact with the fourth semiconductor region;
    a p-type sixth semiconductor region adjoining the fourth semiconductor region, having a higher maximum doping concentration than the fourth semiconductor region and arranged between the fourth semiconductor region and the first metallization;
    a second metallization arranged on the main surface and in ohmic contact with the third semiconductor region; and
    a third metallization arranged on the main surface and in ohmic contact with the seventh semiconductor region.

14. The semiconductor device of claim 13, wherein the semiconductor body further comprises a p-type eighth semiconductor region in ohmic contact with the second metallization and adjoining the fifth semiconductor region.

15. The semiconductor device of claim 13, wherein the second metallization comprises, in a cross-section substantially orthogonal to the main surface, a first portion arranged on the third semiconductor region and a second portion adjoining the first semiconductor region and arranged between the first metallization and the third metallization.

16. A normally-off high-electron-mobility field effect transistor, comprising:
    a first metallization;
    a second metallization;
    a third metallization; and
    a semiconductor body, comprising:
        a first semiconductor region of a first semiconductor material having a first band-gap;
        a second semiconductor region of a second semiconductor material having a second band-gap lower than the first band-gap, the first semiconductor region and the second semiconductor region forming a heterojunction in ohmic contact with the third metallization;
        an n-type third semiconductor region in ohmic contact with the second metallization and having a third band-gap; and
        a p-type fourth semiconductor region in ohmic contact with the first metallization, the fourth semiconductor region adjoining the third semiconductor region and having a fourth band-gap lower than at least one of the second band-gap and the third band-gap,
    wherein the first semiconductor region comprises aluminum gallium nitride or aluminum indium nitride, wherein the second semiconductor region comprises gallium nitride, and wherein the fourth semiconductor region comprises poly-silicon, poly-germanium or poly-silicon-germanium.

17. The transistor of claim 16, wherein the fourth band-gap is lower than at least one of the second band-gap and the third band-gap by at least about 1 eV.

18. The transistor of claim 16, further comprising an n-type fifth semiconductor region adjoining at least one of the first semiconductor region, the second semiconductor region and the fourth semiconductor region, wherein the fourth semiconductor region is arranged between the third semiconductor region and the fifth semiconductor region.

* * * * *